United States Patent
O'Leary et al.

(10) Patent No.: US 6,333,853 B2
(45) Date of Patent: *Dec. 25, 2001

(54) CONFIGURATION OF POWER ELECTRONIC DEVICE MODULES

(75) Inventors: Raymond P. O'Leary, Evanston; Ronald D. Atanus, Mt. Prospect; Richard P. Mikosz, Hickory Hills, all of IL (US)

(73) Assignee: S&C Electric Company, Chicago, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,100

(22) Filed: Dec. 22, 1998

(51) Int. Cl.⁷ ...................................................... H05K 7/20
(52) U.S. Cl. .......................... 361/704; 361/710; 361/718; 165/80.3; 165/185; 257/718
(58) Field of Search .................................. 361/704–719, 361/690–695, 687, 707–711, 722, 735, 790, 749; 165/80.2, 80.3, 80.4, 104.33, 185; 257/706–727, 704–711; 174/16.3, 16 MS; 363/55–58, 132–137; 317/100

(56) References Cited

U.S. PATENT DOCUMENTS

| | | | |
|---|---|---|---|
| 2,815,472 | * 12/1957 | Jackson | 317/234 |
| 3,364,987 | * 1/1968 | Byland | 165/80 |
| 3,652,903 | * 3/1972 | Ericksson et al. | 317/234 R |
| 3,697,814 | * 10/1972 | Christman et al. | 317/100 |
| 3,766,977 | * 10/1973 | Pravda et al. | 165/47 |
| 3,864,607 | * 2/1975 | Phillips | 317/100 |
| 3,955,122 | * 5/1976 | Maynard et al. | 317/100 |
| 4,097,036 | * 6/1978 | Henke | 269/254 R |
| 4,161,016 | * 7/1979 | Born et al. | 361/388 |
| 4,338,652 | * 7/1982 | Romanczuk et al. | 361/388 |
| 4,866,503 | * 9/1989 | Kushibiki et al. | 357/51 |
| 5,043,797 | * 8/1991 | Lopes | 357/82 |
| 5,164,624 | * 11/1992 | Desai et al. | 310/68 D |
| 5,424,919 | * 6/1995 | Hielbronner | 361/710 |
| 5,986,906 | * 11/1999 | Ramezani et al. | 363/58 |

FOREIGN PATENT DOCUMENTS

362160069A * 7/1987 (JP) .............................. H02M/1/088

* cited by examiner

*Primary Examiner*—Leo P. Picard
*Assistant Examiner*—Michael Datskovsky
(74) *Attorney, Agent, or Firm*—James V. Lapacek

(57) ABSTRACT

An efficient configuration for a power system is provided, e.g. for high-speed source transfer, utilizing power electronic assemblies and a directed ventilation arrangement. Each power electronic assembly includes a plurality of stacked power electronic device modules that are electrically series connected and energized at various voltages. Each power electronic device module includes two heat sinks, a power electronic component assembly interposed between the two heat sinks, and an arrangement for clamping the heat sinks and the power electronic component assembly. In a preferred embodiment, the power electronic component assembly includes two stacked, series connected power electronic components such that single-sided cooling is provided. In one application, the power-electronic components are thyristors that have a high short-term, fault-current rating and a relatively low average current requirement. This arrangement provides a reduced height configuration along with the advantages of modular clamping for ease of assembly, simplicity of components, ease of maintenance and overall reliability of components.

6 Claims, 4 Drawing Sheets

CONFIGURATION OF POWER ELECTRONIC DEVICE MODULES

BACKGROUND OF THE INVENTION

1. Field of the Invention

The present invention relates generally to power electronic devices and more particularly to an efficient configuration of stacked power electronic device modules.

2. Description of the Related Art

Various assemblies of power electronic devices to form medium voltage switches and the like are known. For example, the following publications depict commercial arrangements: ABB brochure 34–300 (Sep. 1996), and PQA'97 North America (Mar. 3–6, 1997) paper entitled "Switching Megawatts in Microseconds". The power electronic devices require compression clamping for suitable operations and heat dissipation. This can be accomplished either by clamping the overall assembly or individual clamping of subassemblies. Heat sinks are required to maintain the power electronic devices at suitable operating temperatures over the desired operating range. To this end, heat sinks are clamped about the power electronic devices.

While the enclosures of the prior art arrangements may be useful to provide certain useful operational features, the prior arrangements are large in size and are relatively difficult to assemble and disassemble.

SUMMARY OF THE INVENTION

Accordingly, it is a principal object of the present invention to provide an efficient configuration for a power system utilizing stacked power electronic device modules and a directed ventilation arrangement.

It is another object of the present invention to provide a power electronics assembly of stacked power electronic modules that are modularly clamped with each module including two back-to-back power electronic components that are mounted between heat sinks.

These and other objects of the present invention are efficiently achieved by the provision of an efficient configuration for a power system, e.g. for high-speed source transfer, utilizing power electronic assemblies and a directed ventilation arrangement. Each power electronic assembly includes a plurality of stacked power electronic device modules that are electrically series connected and energized at medium voltage. Each power electronic device module includes two heat sinks, a power electronic component assembly interposed between the two heat sinks, and an arrangement for clamping the heat sinks and the power electronic component assembly. In a preferred embodiment, the power electronic component assembly includes two stacked, series connected power electronic components such that single-sided cooling is provided. In one application, the power-electronic components are thyristors that have a high short-term, fault-current rating and a relatively low average current requirement.

With this arrangement, the heat sinks are suitably dimensioned to provide adequate temperature operation of the power electronic components along with the directed ventilation. This results in an overall power electronics assembly that is of smaller dimensions and overall configuration compared to a double-sided cooling configuration while also providing desirable clamping configurations on a modular basis. While the heat sinks are taller than conventional extruded heat sinks for double sided cooling configurations, with modular clamping, the result is an overall stack height of the power electronic assembly of power electronic modules that would be more than fifty percent larger if double-sided cooling were utilized. This arrangement also provides the advantage of modular clamping for ease of assembly, simplicity of components, ease of maintenance and overall reliability of components.

BRIEF DESCRIPTION OF THE DRAWING

The invention, both as to its organization and method of operation, together with further objects and advantages thereof, will best be understood by reference to the specification taken in conjunction with the accompanying drawing in which.

DETAILED DESCRIPTION

Figure 1:
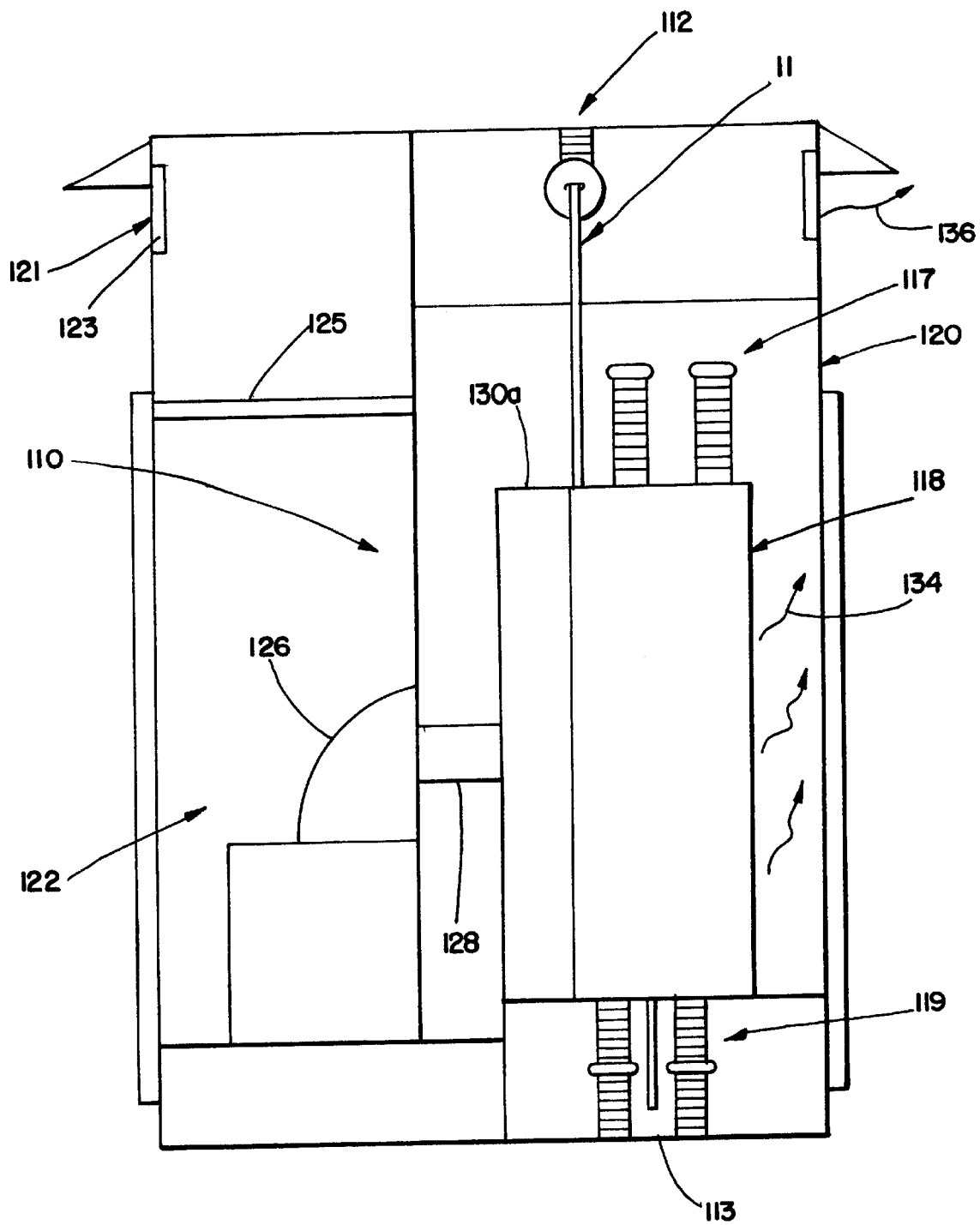
FIG. 1 is a right-side elevational view, with parts removed for clarity, of a power system incorporating a configuration of stacked power electronic device modules in accordance with the present invention.
Figure 2:
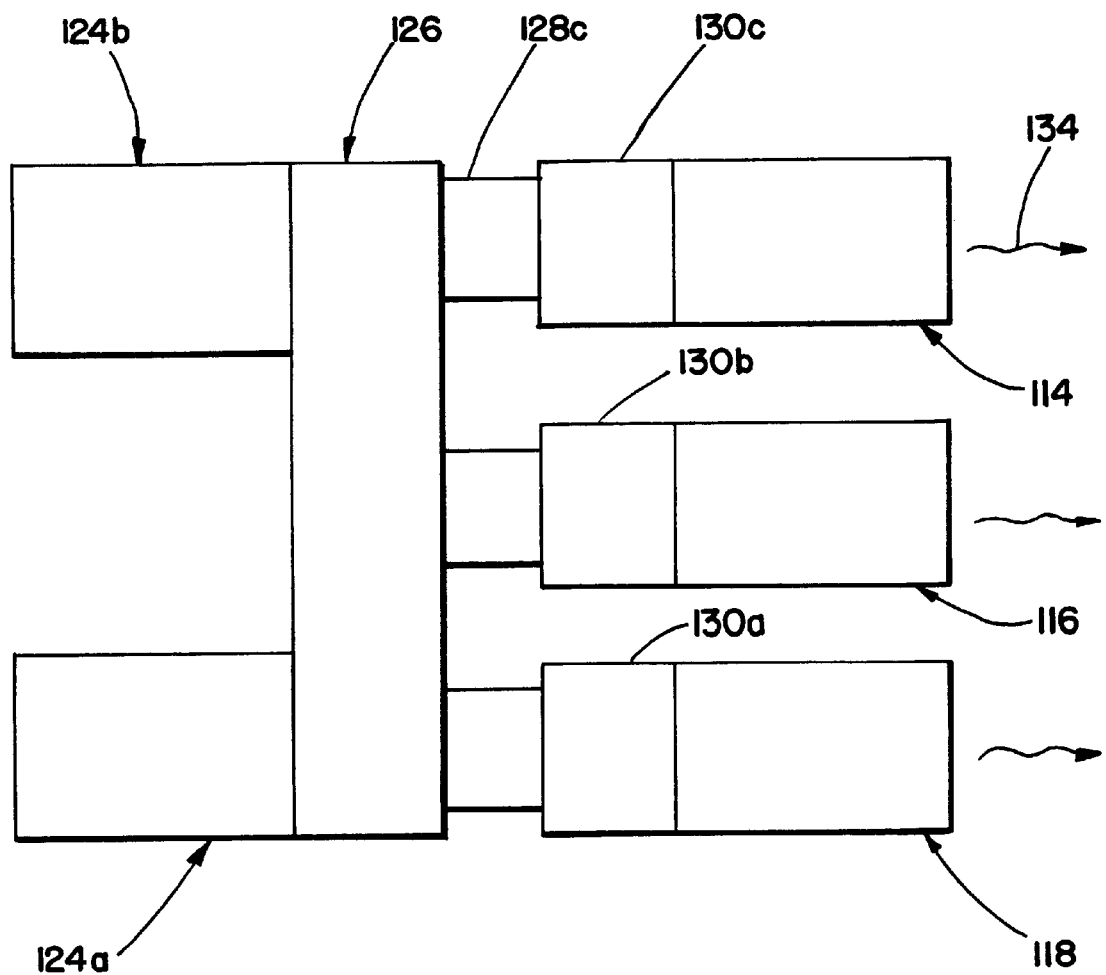
FIG. 2 is a top plan view of portions of the power system of FIG. 1 with parts removed for clarity.

Referring now to FIGS. 1 and 2, a power system 112 includes power electronic assemblies 114, 116 and 118 of the present invention illustrated in conjunction with a ventilation arrangement 110. The ventilation arrangement 110 is useful to provide a predetermined pattern and volume of directed cooling air for the power electronic assemblies 114, 116 and 118 within an enclosure 120 of the power system 112. In a specific embodiment, medium voltages are applied across the power electronic assemblies 114, 116 and 118, e.g. 2–34 kv. In an illustrative application, each of the power electronic assemblies 114, 116 and 118 corresponds to an individual phase or pole of a multi-phase AC power system. The power electronic assemblies 114, 116 and 118 dissipate large quantities of heat such that large volumes of air flow are required to ensure that the assemblies are maintained at suitable operating temperatures to allow adequate performance of their functions. The power-electronic assemblies 114, 116 and 118 are supported within the enclosure 120 via suitable insulators, for example as illustrated generally in FIG. 1 at 117, 119.

The ventilation arrangement 110 includes an air intake section 122 (FIG. 1) which draws in air at 121 via an air intake 123 and high pressure blowers at 124. In a specific embodiment, two blowers 124a and 124b are provided for redundancy in case one of the blowers should become non-functional. The air is drawn through filters 125 and through the high pressure blowers 124 and delivered into a plenum 126. The plenum 126 communicates to insulating ducts 128. In the illustrative embodiment, three insulating ducts 128a, 128b and 128c (FIG. 2) are connected to supply air to respective insulating plenums 130a, 130b and 130c, one to supply air to each of the power electronic assemblies 114, 116, and 118. The air is directed through the power electronic assemblies 114, 116 and 118 and exits at 134 into the interior of the enclosure 120 and out of the enclosure 120 through an exhaust outlet at 136. Both the intake 123 and the outlet 136 include suitable vandal-deterrent features. The plenum 130 is fabricated from insulating materials such as GPO-3 fiberglass material. The insulating duct 128 is also fabricated from insulating material. In a preferred embodiment for medium-voltage applications, the insulating duct 128 is fabricated from a material having extremely low leakage characteristics, e.g. poly methyl methacrylate (acrylic) or cycloaliphatic epoxy, so as to provide extremely low tracking characteristics. For example, the insulating duct 128 provides appropriate dielectric withstand (e.g. BIL voltages in the range of 50–150 kv) for the various maximum potential differences between the power electronic assemblies 114, 116 and 118 and the connected air delivery components, e.g. the plenum 126 which is fabricated from steel in a specific embodiment.

Figure 3:
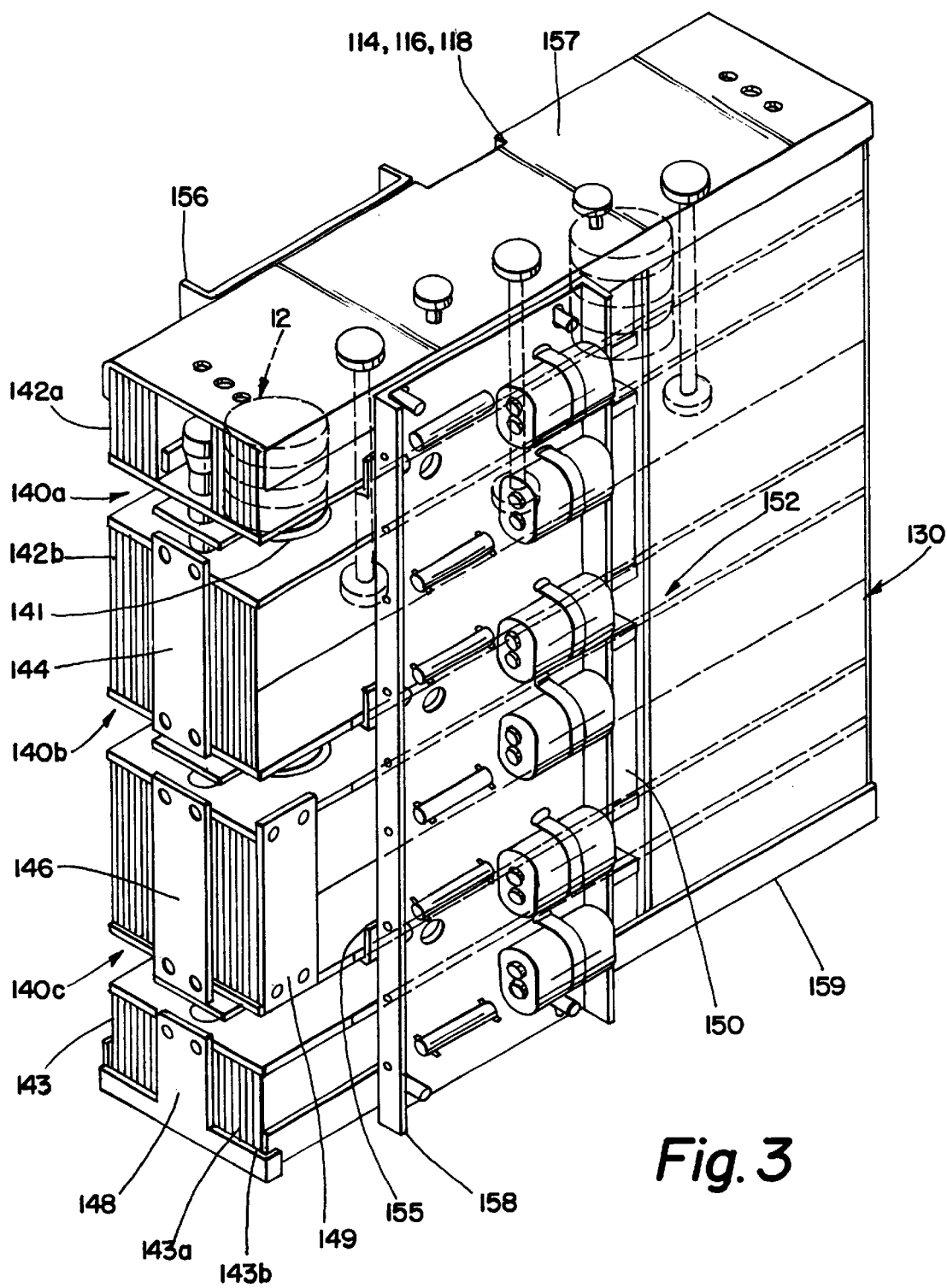
FIG. 3 is a perspective view of the configuration of stacked power electronic device modules of the power system of FIGS. 1 and 2.

Referring now additionally to FIG. 3, each of the power electronic assemblies 114, 116 and 118 includes power electronic device modules 140 that are stacked one atop the other, e.g. as illustrated at 140a, 140b and 140c. In an illustrative embodiment, the power electronic device module 140 include compression-mounted power electronic devices 141 such as semiconductors that are clamped between interposed heat sink arrangements 142, e.g. as illustrated at 142a and 142b. The heat sinks 142 include spaced fins 143 that are generally planar, e.g. as illustrated at 143a, 143b. The heat sinks 142 are arranged such that the end portion 150 faces the plenum 130, the air being directed out of the plenum 130 in a direction 152 between and along the fins 143 of the heat sinks 142, i.e. parallel to the planes of the fins 143, with the air exiting from the front end portion 153 of the power electronic stages 140 in a direction 154. The power electronic stages 140 are carried or supported via angle brackets 155 so as to provide slide-in rack mounting of the power electronic stages 140. The angle brackets 155 are carried by opposed structural supports 156, 158. The structural supports 156, 158 are attached to and supported by upper and lower channels 157 and 159. The channels 157 and 159 also provide support for the plenum 130. The supports 156, 158 and the channels 157, 159 also provide additional flow-directing functions by bounding the perimeter of the power electronic stages 140.

In one specific embodiment, bus interconnection plates 144, 146 are provided at the front end 153 of the power electronic stages 140 to provide electrical connection between the stages 140a and 140b and the stages 140b and 140c respectively so as to connect the stages 140a, 140b and 140c in electrical series relationship. A bus connection plate 148 is provided at the front end of the stage 140c, a similar bus connection plate (not shown) being provided at the front end of the stage 140a. In a specific illustrative arrangement, the power electronic assemblies 114, 116 and 118 are connected to bus structure generally referred to at 111, 113 in FIG. 1. The plates 144, 146 and 148 provide additional flow efficiency by closing off the openings at the front 153 of the power electronic stages 140, creating a high pressure zone at the output of the plenum 130 at the back end portion 150 of the power electronic stage 140.

In another specific embodiment, a bus interconnection plate 149 is utilized to provide electrical interconnection between the stages, e.g. 140b and 140c, in which case the plates 144, 146 and 148 solely provide the function of an air dam and need not be conductive.

Figure 4:
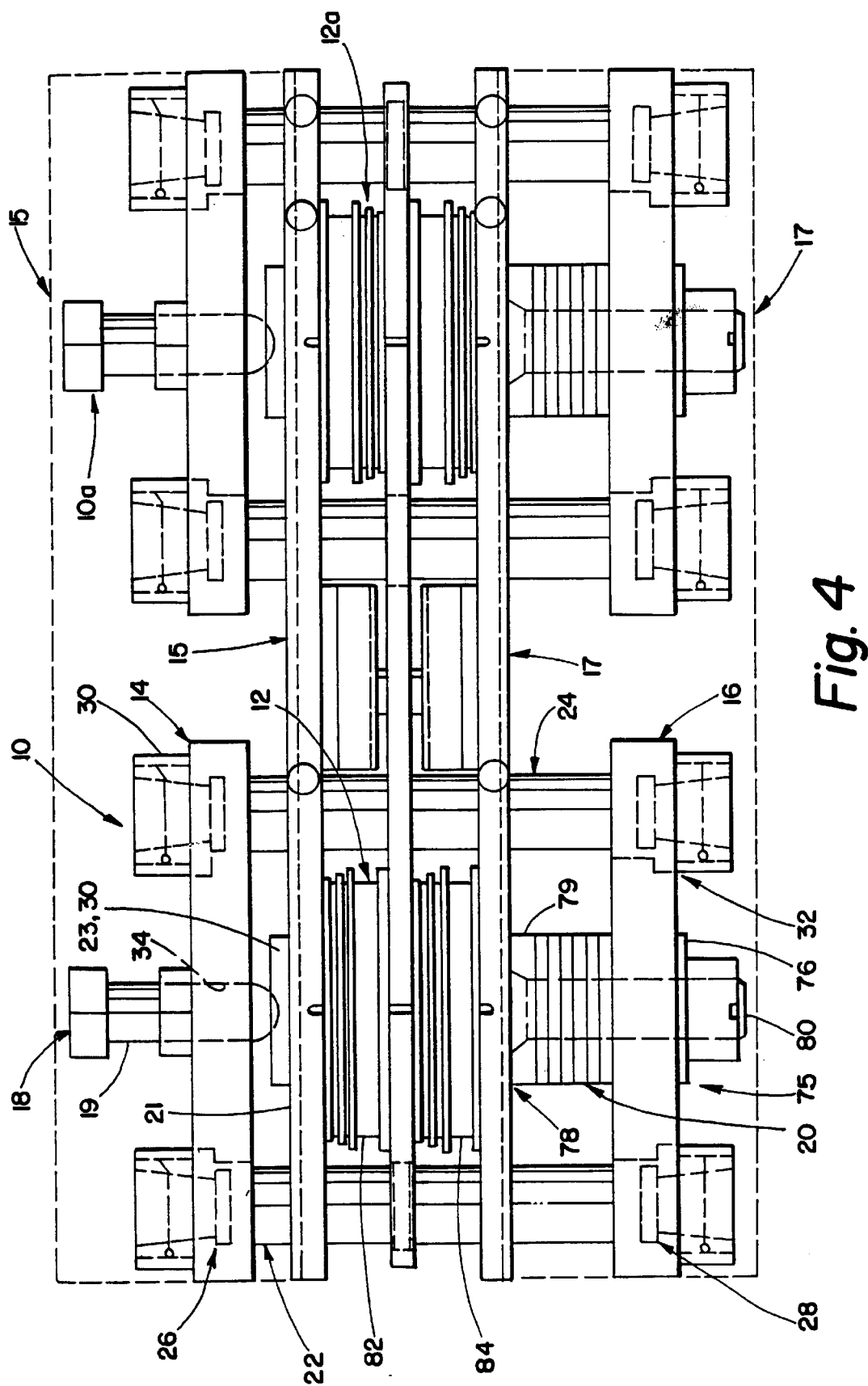
FIG. 4 is a front elevational view of a power electronic device module of the configuration of stacked power electronic device modules of FIGS. 1–3.

In accordance with important aspects of the present invention, and referring now additionally to FIG. 4, preferably the power electronic device modules 140 includes a clamping arrangement 10 to apply suitable clamping forces to a compression-mounted semiconductor device 12 (similar to 141 of FIG. 3) through two heat sinks 15, 17 (similar to 142a, 142b of FIG. 3) mounted on opposed sides of the interposed semiconductor device 12. The clamping arrangement 10 includes provisions on either side of the semiconductor device 12 and the heat sinks 15, 17 for applying predetermined suitable clamping forces, e.g. in a specific illustration, 10–17,000 pounds of clamping force. To this end, the clamping arrangement 10 includes two spaced apart clamping beams 14, 16, which may also be characterized as bar members, are provided on opposite sides of the semiconductor device 12, an operable clamping member 18 carried by the clamping beam 16, and a stack or plurality of spring washers 20 positioned the between the semiconductor device 12 and the clamping beam member 16. The clamping arrangement 10 also includes elongated members 22, 24, generally in the shape of rods, for mounting and retaining the clamping beams 14, 16 when the operable member 18 is manipulated to apply clamping force to the semiconductor device 12.

The spring washers 20 provide a desirable force distribution, the desired clamping force for appropriate electrical connection of the semiconductor device 12, and suitable heat conduction to the heat sinks 15,17. The elongated members 22, 24 are fabricated from an insulating material, and are pultruded fiberglass rods in a specific embodiment. Since there is an impressed electrical potential across the semiconductor device 12, electric field stress concentrations must be considered and minimized via the appropriate conformity and interfitting of the various components that interface with the elongated members 22, 24 and the clamping beams which are electrically at the potential at of the semiconductor device 12.

The elongated members 22, 24 and the clamping beam members 14, 16 include cooperating structure and arrangements that are generally referred to at 26, 28, 30 and 32 which cooperate to hold the clamping beam members 14, 16 about the semiconductor device 12 when clamping force is applied via the operable member 18. For example the operable member 18 includes a threaded bolt 19 that is threadingly received through a threaded portion 34 of the clamping beam 14 with the bolt 19 extending to apply force to a base plate 21 of the heat sink 15 through an interposed clamping disc 23.

In accordance with important aspects of the present invention, each of the semiconductor devices 12 includes devices 12a, 12b that are arranged in the power electronic device module 140 for single-sided cooling. With this arrangement, the heat sinks 15, 17 are suitably dimensioned to provide adequate temperature operation of the devices 12a, 12b along with the directed ventilation via 110. This results in an overall power electronics assemblies such as 114, 116 and 118 that are of smaller dimensions and overall configuration than double-sided cooling configuration while also providing desirable clamping configurations on a modular basis. While the heat sinks 15, 17 are taller than conventional extruded heat sinks for double sided cooling configurations, with modular clamping, the result is an overall stack height for 114 which would be more than fifty percent taller if double-sided cooling were utilized while also providing the advantages of modular clamping for ease of assembly, simplicity of components, ease of maintenance and overall reliability of components.

While there have been illustrated and described various embodiments of the present invention, it will be apparent that various changes and modifications will occur to those skilled in the art. Accordingly, it is intended in the appended claims to cover all such changes and modifications that fall within the true spirit and scope of the present invention.

What is claimed and desired to be secured by Letters Patent of the United States is:

1. A medium-voltage power electronic assembly comprising:

a plurality of modules being arranged to form a linear array, each of said plurality of modules including heat-sink means, two power electronic devices disposed between said heat sink means for single-sided cooling thereof, said power electronic devices having high short-term, fault current ratings and a relatively low average current requirement, and modular clamping means for each of said plurality of modules for clamping said power electronic devices with respect to said heat-sink means so as to provide clamping on a modular basis.

2. The power electronic assembly of claim 1 further comprising means for defining directed air flow in a predetermined directed relative to each of said heat-sink means.

3. The power electronic assembly of claim 1 further comprising means for supporting said plurality of modules and for defining predetermined ventilation paths through said plurality of modules.

4. The power electronic assembly of claim 1 further comprising means for electrically connecting said plurality of modules in electrical series relationship and for directing air flow through said medium-voltage power electronic assembly.

5. The power electronic assembly of claim 1 wherein said plurality of modules are arranged in two or more stacks with said modules in each stack being arranged in electrical series connection.

6. A medium-voltage power electronic assembly comprising a plurality of stacked power electronic device modules that are electrically series connected and energized at various voltages, each of said power electronic device modules comprising two heat sinks, a power electronic component assembly interposed between said two heat sinks, and modular clamping means for each of said plurality of stacked power electronic device modules for clamping said heat sinks and said power electronic component assembly so as to provide clamping on a modular basis, wherein said power electronic component assembly comprises two power electronic components such that said components are provided single-sided cooling, said power electronic devices having high short-term, fault current ratings and a relatively low average current requirement.

* * * * *